United States Patent

Song

[11] Patent Number: 5,818,766
[45] Date of Patent: Oct. 6, 1998

[54] DRAIN VOLTAGE PUMP CIRCUIT FOR NONVOLATILE MEMORY DEVICE

[75] Inventor: Paul Jei-Zen Song, Sunnyvale, Calif.

[73] Assignee: Integrated Silicon Solution Inc., Santa Clara, Calif.

[21] Appl. No.: 811,946

[22] Filed: Mar. 5, 1997

[51] Int. Cl.$^6$ ................................................ G11C 7/00
[52] U.S. Cl. .............................. 365/189.11; 365/189.09; 365/226; 327/536
[58] Field of Search .......................... 365/189.11, 189.09, 365/226; 327/536, 548, 534, 535, 537

[56] References Cited

U.S. PATENT DOCUMENTS

| | | | |
|---|---|---|---|
| 5,367,489 | 11/1994 | Park et al. | 365/189.11 |
| 5,528,538 | 6/1996 | Sakuta et al. | 365/189.11 |
| 5,546,296 | 8/1996 | Savignac et al. | 327/536 |
| 5,561,385 | 10/1996 | Choi | 327/536 |

*Primary Examiner*—Son T. Dinh
*Attorney, Agent, or Firm*—Douglas J. Crisman; Flehr Hohbach Test Albritton & Herbert LLP

[57] ABSTRACT

A program drain voltage pump is provided that employs multiple pumping sections that are adaptively controlled to provide a pumped drain voltage (VD) that rises smoothly and rapidly to an optimum VD level for programming EPROM or flash memory cells and maintains VD at the optimum level with minimal ripple. The pumping sections are configured to pump a common VD node that is coupled to the drains of the EPROM or flash memory cells. Each pumping section is driven by a clock signal whose pulses are out of phase with the clock signals driving the other pumping sections. All of the clock signals have roughly the same frequency. Due to the staggered clocks, each pump is activated during a different respective time period, which smooths out VD. Additionally, to provide an even faster and smoother pumped VD than with multiphase clocking alone, an embedded controller is provided that adaptively adjusts the frequency and slew rate of the various clock pulses throughout the pumping operation, which alters the amount by which VD is raised for a given clock pulse.

18 Claims, 5 Drawing Sheets

DRAIN VOLTAGE PUMP CIRCUIT FOR NONVOLATILE MEMORY DEVICE

The present invention relates generally to nonvolatile semiconductor memory systems, such as EPROMs and flash memories and, more specifically, to an on-chip drain voltage pump for nonvolatile memories that operate from a single power supply.

BACKGROUND OF THE INVENTION

Solid state and so-called flash memories are known in the art. An individual flash memory cell includes a metal-oxide-semiconductor ("MOS") device having spaced-apart drain and source regions fabricated on a substrate and defining a channel region therebetween. A very thin gate oxide layer overlies the channel region, and a floating charge-retaining storage gate overlies the channel region and is unconnected to the cell. A control gate at least partially overlies the floating gate and is insulated therefrom.

In practice, a plurality of such memory cells are arrayed in addressable rows and columns to form a flash memory array. Individual cells in the array are accessed for purposes of writing, reading or erasing data by decoding row and column information.

Typically, the control gates for a group of cells in a given row are formed from a continuous strip of conductive material that defines a so-called word line, abbreviated "WL". A word line might comprise, for example, a group of eight cells that collectively store one byte. For a given column in the array, the drain leads of all cells in the column are coupled to a so-called bit line, abbreviated "BL". The source leads of the various cells are collectively switchably coupled to one of several potential levels, depending upon whether cells in the array are to be programmed (written) or erased or are to be read.

Within the memory array, an individual cell is addressed and thus selected for reading, programming (writing) or erasing by specifying its row (or word line) as an x-axis coordinate, and its column (or bit line) as a y-axis coordinate. A 16 K-bit memory, for example, may comprise an array of 128×128 bits, in which there are 128 x-axis word lines and 128 y-axis bit lines. Commonly, blocks of memory cells are collectively grouped into sectors. Cell addressing is accomplished by coupling address bits to x-decoders and to y-decoders whose respective outputs are coupled to word lines and bit lines in the array.

Programming an addressed MOS memory cell occurs in a program mode by accelerating so-called hot electrons. These electrons are injected from the drain region through the thin gate oxide and onto the floating gate. The control gate-source threshold voltage required before substantial MOS device drain-source current occurs is affected by the amount of such charge retained on the floating gate. Thus, storage cell programming forces the floating storage gate to retain charge that will cause the cell to indicate storage of either a logical "1" or "0" in a read-out mode.

The above-described storage cells are non-volatile in that the charge on the storage gate, and thus the "0" or "1" bit stored in the cell, remains even when control and operating voltages to the array are turned off. In the program (write) mode, the control gate is coupled to a high positive potential of perhaps +10 VDC, the drain is coupled to perhaps +6 VDC (optimally, between 5.5 and 6.5 VDC), and the source and substrate are grounded (meaning that they are coupled to the circuit ground node). This causes the hot electrons to be generated and captured by the floating gate.

Many EPROMs and flash memories are designed to operate with a single VCC power supply, typically +5 volts ±10% (i.e., between 4.5 and 5.5 volts). This means that the drain and control gate program voltages, which are in excess of the VCC voltage level, must be achieved through charge pumping. Typically, separate voltage pumps are provided to establish the source and drain program voltage levels and to distribute the source program voltage level throughout the memory array. As the present application is directed to an improved drain voltage pump, the other types of voltage pumps are not addressed further.

FIG. 1 shows a conventional system 110 for pumping the drain voltage (VD) of EPROM/flash cells to an optimum VD level (i.e., between 5.5 and 6.5 volts) for EPROM or flash memory programming. The system 110 is a simple, single phase pump that incorporates two native mode transistors 112, 114 (each with threshold voltages $V_t$ of approximately 0.2 V) and a MOS capacitor 116. The gate of the transistor 112 is tied to a programming signal PGM, which is maintained at VCC during a programming operation. The transistor 112 has a drain tied to the VCC node and a source coupled to the drain of the transistor 114 and, at node A, one terminal of the MOS capacitor 116. The other terminal of the capacitor 116 is driven by a clock signal $\phi$. The gate of the transistor 114 is coupled to node A and the source of the transistor 114 is coupled to the VD node, to which the drains of the EPROM/flash cells 120 are tied.

When the PGM signal is asserted at the beginning of a program cycle, the native mode transistor 112 turns on and connects the VCC node to node A and the capacitor 116. Upon the occurrence of a low to high transition of the clock signal $\phi$, the capacitor 116 begins to transfer charge, which increases the voltage at node A (VA). As VA rises above the threshold voltage $Vt_{114}$ of the transistor 114, the transistor 114 turns on and VD rises with VA. When $\phi$ makes a high to low transition, charge transfer ceases through the capacitor 116, causing VA and VD to drop. When VA is lower than $VCC-Vt_{112}$ (the threshold voltage of the transistor 112), this downward trend of VA is counteracted by charge flowing from the VCC node to node A through the transistor 112. By careful design, the charge transferred into the system through the transistor 112 and the capacitor 116 should exceed the amount of charge consumed by the load at node D ($I_{program}$). Consequently, upon the initiation of pumping, VA and VD rise in a series of positive and negative steps.

At some point during pumping VA rises to a level (i.e., greater than $VCC-Vt_{112}$) where the transistor 112 stops conducting. This means that, following high to low transitions, no charge from VCC is provided to offset the program loading current $l_{program}$ at the node VD. This effect eventually causes the average over time of VA and VD to stabilize. The particular average value at which VA and VD stabilize can be determined by careful selection of the transistors 112, 114 and the capacitor 116 in view of the current consumed for programming $I_{program}$. Note that a charge pump configured as in FIG. 1 can be used to achieve pumped voltages that are no higher than $2(VCC)-2V_t$, as the final pumped voltage is limited by the capacitance of the capacitor 116.

Even though VA and VD eventually stabilize at predetermined average levels, over time these signals exhibit significant rippling due to the repeated charging and discharging of the capacitor 116 caused with the cycling of $\phi$. This rippling is undesirable as it causes significant variations in the current available to program the EPROM/flash cells whose drains are coupled to the VD node.

FIG. 2A shows a voltage (V) versus time (t) plot of a hypothetical VD signal produced by the pump 110. The part of the plot between the references 202 and 204 corresponds to a pumping interval wherein VA is being increased. The part of the plot between the references 204 and 206 illustrates the ripple in VD once the target drain program voltage level (VD$_{target}$) is reached. FIG. 2B shows a voltage versus time plot of the corresponding φ signal.

SUMMARY OF THE INVENTION

The present invention is an improved charge pump for use in an EPROM/flash memory array that provides a pumped drain voltage (VD) for use during programming. Following the inception of a programming operation, the present invention pumps VD from VCC to a target program drain voltage (VD$_{target}$). Once VD is within an acceptable range of VD$_{target}$, the present invention maintains VD at that level without significant rippling.

Specifically, the present invention includes a ring oscillator circuit that provides a plurality of overlapping clock signals, each of which has a voltage profile and frequency that is controlled by the ring oscillator. Each clock signal is coupled to a respective conventional pump stage (FIG. 1), which is configured to pump the VD node. By individually controlling the frequency and the voltage profile of the clock signals, the ring oscillator is able to control the amount of pumping performed by the respective pump stages for each pumping cycle. As a result, the voltage at the VD node is smoothly and rapidly pumped during an initial pumping interval from VCC to VD$_{target}$ and maintained throughout the programming operation within a preset ripple range of VD$_{target}$.

In a preferred embodiment, the ring oscillator includes an embedded control system and a plurality of oscillator sections, each of which generates one of the respective clock signals. Each oscillator section includes an oscillator subsystem connected in a ring-like fashion with previous and subsequent oscillator subsystems. Each oscillator subsystem outputs at a desired frequency signal pulses that are coupled to the subsequent oscillator subsystem and an output circuit. The output circuit forms a respective clock signal by adjusting the voltage profile of the signal pulses to match a desired voltage profile. The desired frequency and voltage profile are determined by a control signal generated by the embedded control system based on a comparison of VD and VD$_{target}$.

In a preferred embodiment, VD$_{target}$ is initially much larger than VD. At this point the control system generates a control signal that causes an oscillator sub-section and its corresponding output circuit to generate clock pulses with a higher frequency and a faster slew rate. Eventually, when VD>VD$_{target}$, the control system causes the clock frequency to be lowered and the slew rate to be slowed. Thus, in the present invention the clock frequency and output slew rate are modulated by the differential signal, VD–VD$_{target}$, in a sequence that is repeated during the programming cycle.

DESCRIPTION OF THE PREFERRED EMBODIMENT

Figure 1:
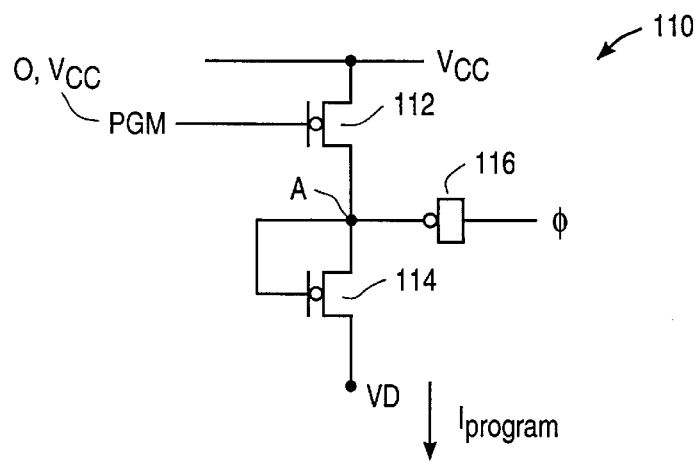
FIG. 1 is a block diagram of a prior art drain voltage pump for a non-volatile memory.
Figure 3:
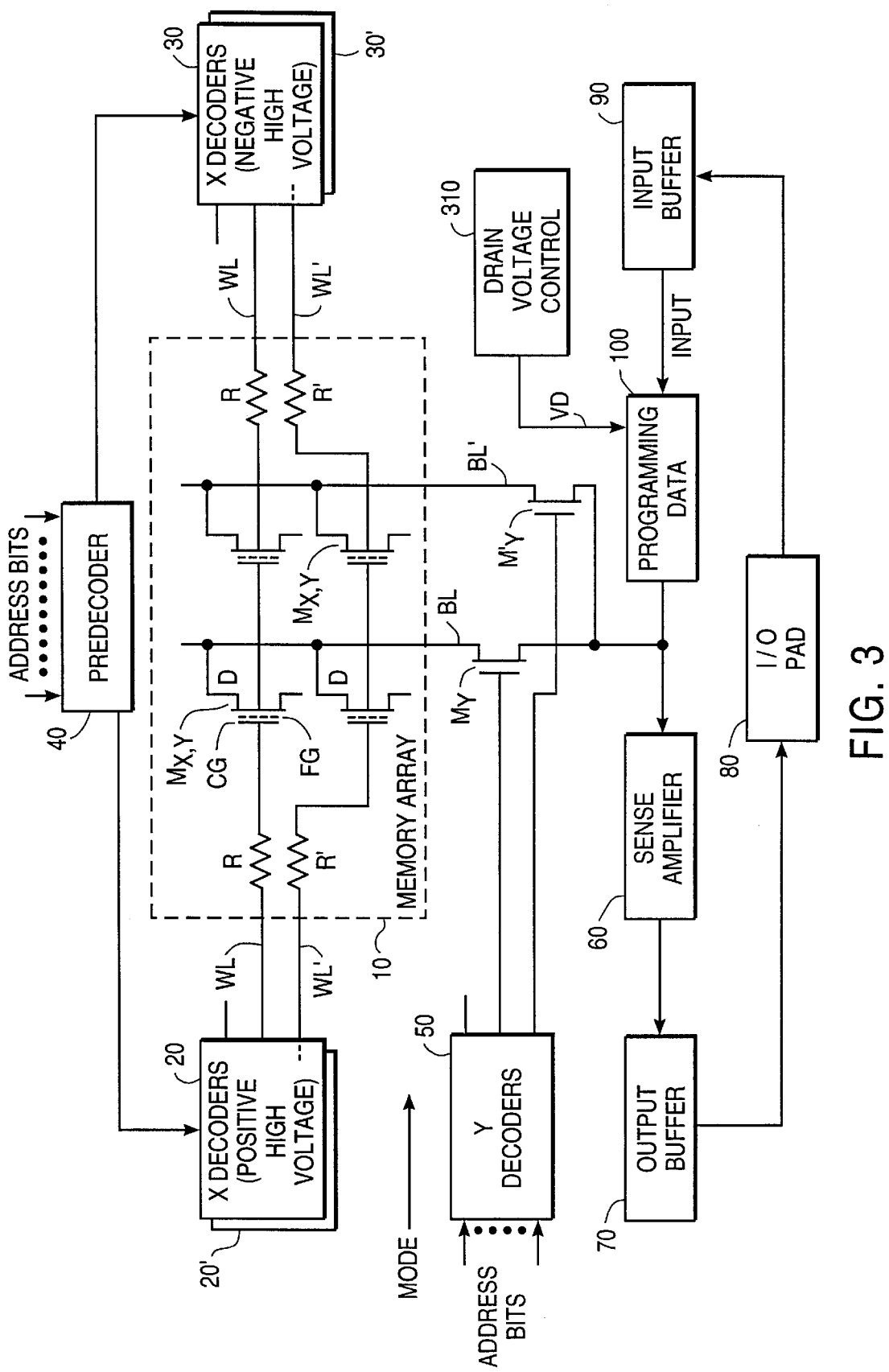
FIG. 3 is a block diagram of an EPROM or flash memory architecture with the present invention may be practiced.

FIG. 3 is a block diagram of an EPROM or flash memory cell architecture with which the present invention may be practiced. A memory array 10 includes a plurality of MOS memory cells such as the cells M$_{x,y}$, and M'$_{x,y}$, each of which has source (S) and drain (D) regions, a floating gate (FG) and a control gate (CG). A plurality of such cells in a given horizontal (or x-axis) row have their control gates coupled together to form a word line (WL). Each word line is selectively pulled-up or pulled-down to a program, read or erase voltage level by an x-axis positive high voltage decoder or by an x-axis negative high voltage decoder. Two word lines are shown in FIG. 1, the word line WL being pulled-up or down by decoder 20 or 30, and the word line WL' being pulled-up or down by decoder 20' or 30'. To minimize high voltage switching transients, each word line preferably includes an associated series resistance 2R of a few KΩ.

A predecoder 40 receives input address information from a host device such as a microprocessor computing system (not shown) and outputs appropriate signals to the decoders, e.g., 20 and 30. In turn, the appropriate decoders will pull an associated word line up or down to a necessary voltage level.

More specifically, the positive high voltage x-decoder 20 pulls a selected word line WL in the memory array 10 up to about +10 VDC in program/write mode, and up to VCC (e.g., ≈+5 VDC) in read mode. The negative high voltage x-decoder 30 pulls the same word line WL down to about −9 VDC in erase mode (if the word line is selected), or down to 0 VDC if unselected in erase mode or in read mode. If the word line 30 is unselected, in program/write mode, the decoder 30 pulls the word line down to 0 VDC. Depending upon the potential to which selected word line WL is pulled by the decoder 20 or by the decoder 30, information in cell M$_{x,y}$ may be read out, erased, or new information may be programmed/written into this cell.

A y-decoder 50 also receives address information from the host device. In conventional fashion, a plurality of cells in a column in the array have their source regions coupled together to form a bit line (BL). The output from the y-decoder 50 turns-on a y-axis select transistor, e.g., M$_y$, which couples the bit line signal to the input of a sense amplifier 60 that reads the stored bit of information in the address-selected cell M$_{x,y}$. If, instead, the cell M'$_{x,y}$ is to be read, the y-decoder 50 will turn on the select transistor M'$_y$. For ease of illustration, only two bit lines, BL and BL', are depicted in FIG. 1 although in practice array 10 will include a great many bit lines.

In a read mode of operation, the sense amplifier output is coupled through an output buffer 70. The "0" or "1" signal stored in an addressed cell M$_{x,y}$ is then provided to an input/output pad 80, from where the information may be accessed by the host device.

Data to be stored within the array 10 is coupled to the input/output pad 80 by the host device, from which the data are coupled to an input buffer 90. The output of buffer 90 is provided to an interface 100 that provides suitable programming data for the array. The system shown in FIG. 1 also receives from the host device mode signals (MODE) commanding either a program/write mode (PGM), erase mode, or a read mode.

The teachings of the present invention are embodied in a drain voltage pump 310 that, in response to the assertion of the PGM signal, controls the drain voltage VD that is applied to the drains of the memory cells for a programming operation via the programming data 100. The present invention addresses some of the problems of conventional drain voltage pumps by providing a VD signal that rises rapidly and smoothly to the target drain voltage level (VD$_{target}$) for program mode and remains at the target level with minimal ripple. Consequently, in an EPROM or flash memory employing the teachings of the present invention, drain program voltage and current are provided far more reliably than is possible with the prior art voltage pump. Details of a preferred embodiment of the present invention are now described in reference to FIGS. 4–7.

Figure 4A:
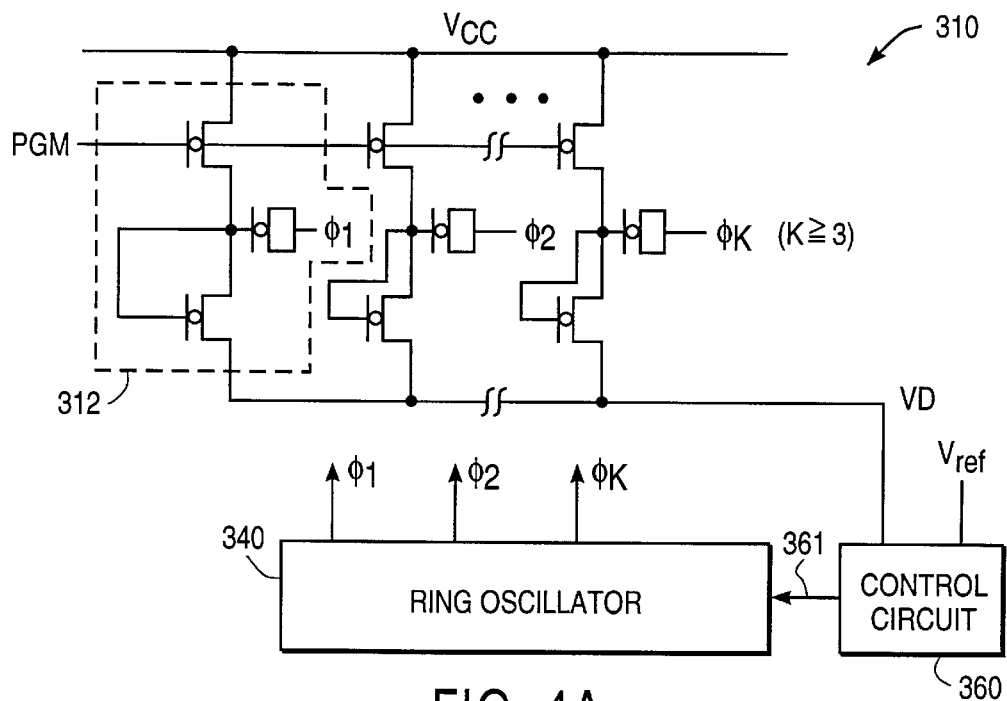
FIG. 4A is a block diagram of a preferred embodiment of the distribution charge pump of the present invention.
Figure 4B:
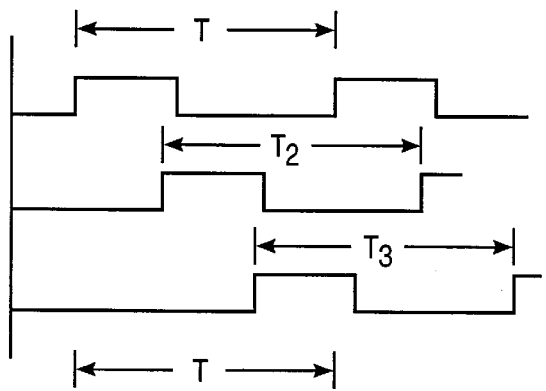
FIG. 4B is a voltage versus time plot of a hypothetical set of clock signals that can be employed in the embodiment of FIG. 4A.

Referring to FIG. 4A, there is shown a block diagram of a preferred embodiment of the drain voltage pump 310 that includes k pumping sections 312 (where k is an integer greater than 2), a ring oscillator 340 and an embedded controller 360. Each pumping section 312 is constructed in the same manner as the single pump 110. The sources of the pumping sections 312 are coupled together to the VD node and each of the pumping sections 312 is coupled to a respective clock signal φ1, φ2, ... φk. The respective clock signals are generated by a ring oscillator 340 so that a pulse from one clock signal φi is asserted at a different respective position in a ring oscillator cycle than the pulse from another clock signal φj. Each of the clock signals has a period T-i that is determined by the period T of a ring oscillator cycle. FIG. 4B shows a hypothetical voltage versus time plot of the clock signals φ1, φ2, φ3 for an instance of the preferred embodiment that uses three pumping sections.

Because the respective clocks φi (where i denotes an integer between 1 and k) each make low-to-high transitions at different respective times during a ring period T, each pumping section 312 is energized to pump the VD node for corresponding different portions of that ring period T. This dramatically smooths the rise of the voltage at the VD node towards the target level and also reduces rippling in the drain voltage once it is established at the target voltage level. The degree to which the ripple is reduced depends directly on the number of clocks φi provided. Thus, the VD ripple can be held to within a predetermined range by selecting an appropriate number of clock signals φi.

An additional feature of the present invention enables an even smoother and more nearly ripple-free pumped drain voltage to be provided for programming. In the preferred embodiment of FIG. 4A, this additional feature is implemented in the ring oscillator 340 and the embedded controller 360. The basis of this additional feature is now described.

Referring to the preferred embodiment of FIG. 4A, the ring oscillator 340 adaptively adjusts the clock frequency f and the slew rate of the clock signals φi so that VD can be rapidly pumped up to the VD$_{target}$ level. At the beginning of pumping (i.e., at the assertion of the PGM signal), when VD is substantially below VD$_{target}$, the ring oscillator 340 sets the frequency f to a base (slow) level and then increases the clock frequency until VD exceeds VD$_{target}$. Once VD is at the VD$_{target}$ level, the clock frequency f is reduced and a control procedure similar to one described above is executed to maintain the level of VD close to VD$_{target}$. The oscillator 340 adjusts the clock slew rate to match the frequency f so that increases in frequency are associated with increases in the clock signal slew rate and decreases in frequency are associated with decreases in the clock signal slew rate. Like higher frequencies, faster slew rates cause increases in VD. This joint adjustment by the ring oscillator 340 of frequency and slew rate permits greater flexibility in maintaining a ripple-free VD.

The ring oscillator 340 is kept apprised of the difference between VD and VD$_{target}$ by the embedded controller 360, which outputs to the ring oscillator 340 a control signal 361 that continually indicates that difference. Based on the control signal 361, the ring oscillator also adjusts the frequency and slew rate of the clock signals so that the clock frequency/slew rate is high/fast or low/slow depending on the relative difference between VD and VD$_{target}$.

Figure 4C:
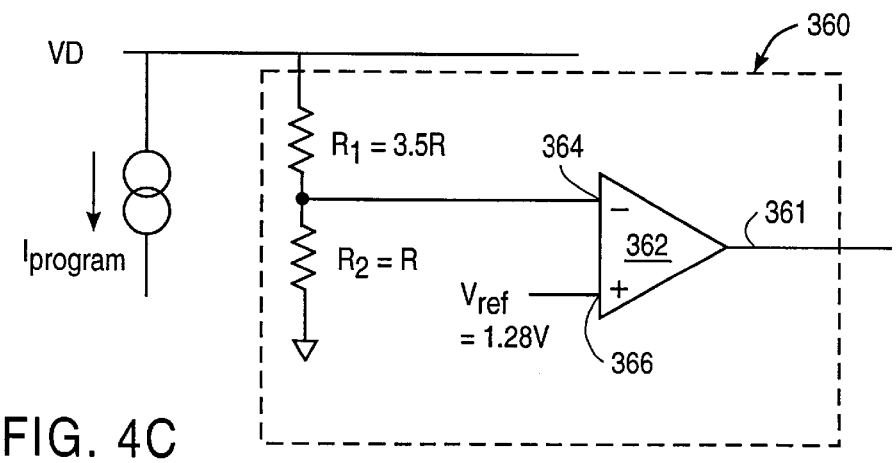
FIG. 4C shows a preferred embodiment of the control circuit 360 of FIG. 4A that employs a comparator.

Referring to FIG. 4C, there is shown a schematic of a preferred embodiment of the comparator 360, which includes two resistors R1, R2 and a comparator circuit 362. The comparator 360 is coupled to the VD node along with the programming load (i.e., the cell being programmed), which draws a current I$_{program}$ during programming. The inverting input 364 of the comparator circuit 362 is coupled to a voltage reference V$_{ref}$. In the preferred embodiment, V$_{ref}$ is set to the bandgap reference (approximately 1.28 V). The non-inverting input 366 is coupled to the output of a voltage divider that includes the resistor R1 coupled to the VD node and the resistor R2 coupled to the circuit ground node. The resistor sizes are selected in accordance with the following expression to ensure a small comparator 362 output when VD is close to VD$_{target}$:

$$V_{ref} \frac{R1 + R2}{R2} = VD_{target}$$

R1 and R2 are selected so that VD$_{target}$ is within the range of the drain voltages needed for memory cell programming. For example, when the necessary drain voltage is between 5.5V and 6V and Vref=1.28V, selecting R1=3.5R and R2=R provides a VD$_{target}$ of approximately 5.76 V (=1.28×4.5).

In view of the schematic of FIG. 4C, it is clear that magnitude of the feedback signal 361 varies directly with the difference between VD and VD$_{target}$ (throughout pumping VD is generally less than VD$_{target}$). Thus, initially, the feedback signal 361 is large and then, as VD becomes close to VD$_{target}$, the feedback signal 361 becomes smaller and smaller.

Figure 2A:
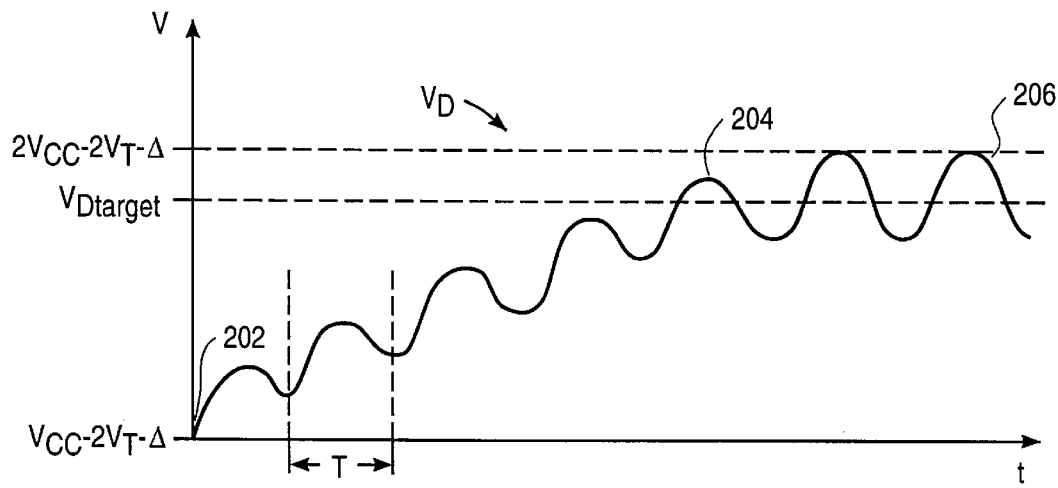
FIG. 2A is a plot of the voltage at node A of FIG. 1 during a pumping operation.
Figure 2B:
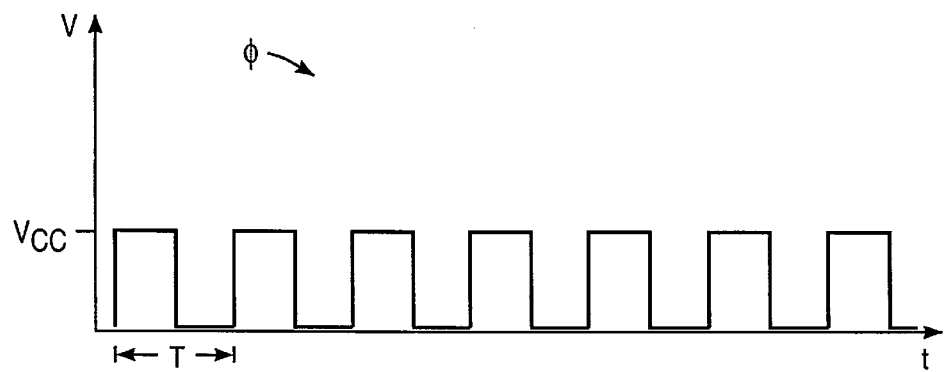
FIG. 2B is a voltage versus time plot of the clock signal φ input to the capacitor 116 of FIG. 1.
Figure 5A:
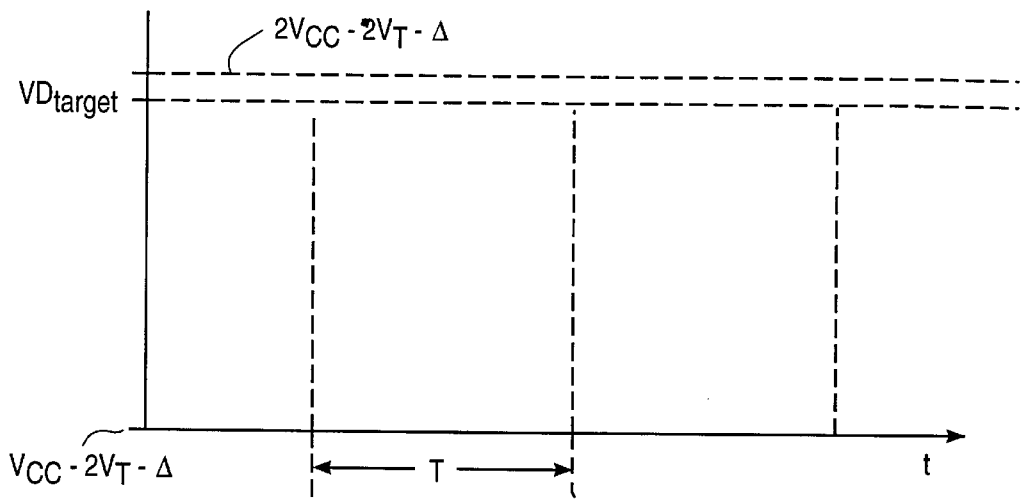
FIG. 5A is a plot of the voltage at node VD provided by the preferred embodiment during a pumping operation.
Figure 5B:
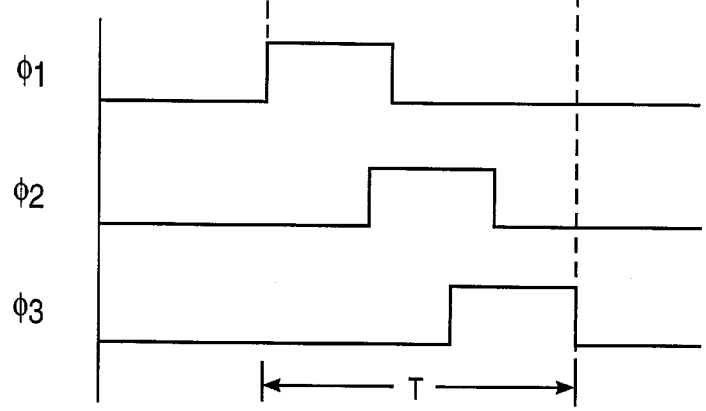
FIG. 5B is a voltage versus time plot of the clock signals φ1, φ2, φ3 provided by a 3-phase (i.e., k=3) implementation of the preferred embodiment.
Figure 5C:
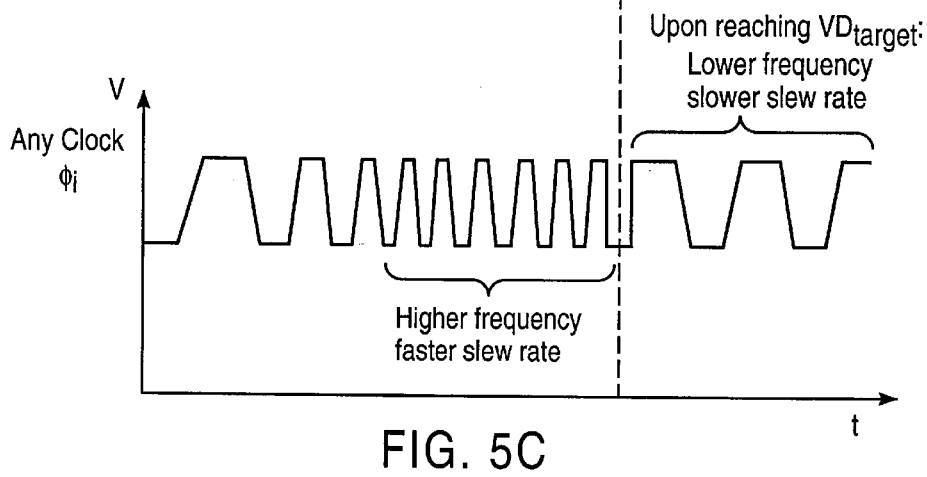
FIG. 5C is a plot of one clock signal φi produced during pumping by the preferred embodiment where, when VD<VD$_{target}$, the clock has a higher frequency and a faster slew rate and, when VD>VD$_{target}$, it has a lower frequency and a slower slew rate.

Exemplary voltage versus time plots of the VA (and VD) signal generated by the preferred embodiment and the related clock signals φ1, φ2, φ3 are shown, respectively, in FIGS. 5A and 5B. Note that VD is pumped to VD$_{target}$ more rapidly (FIG. 5A) than in the prior art system (FIG. 2A) and that less ripple results. These results are achieved in the preferred embodiment due to the overlapping clocks (FIG. 5B) and the adjustments to the clock signal frequency and slew rate shown in FIG. 5C. Note that the frequency and slew rate are increased until VD approximates VD$_{target}$.

Figure 6:
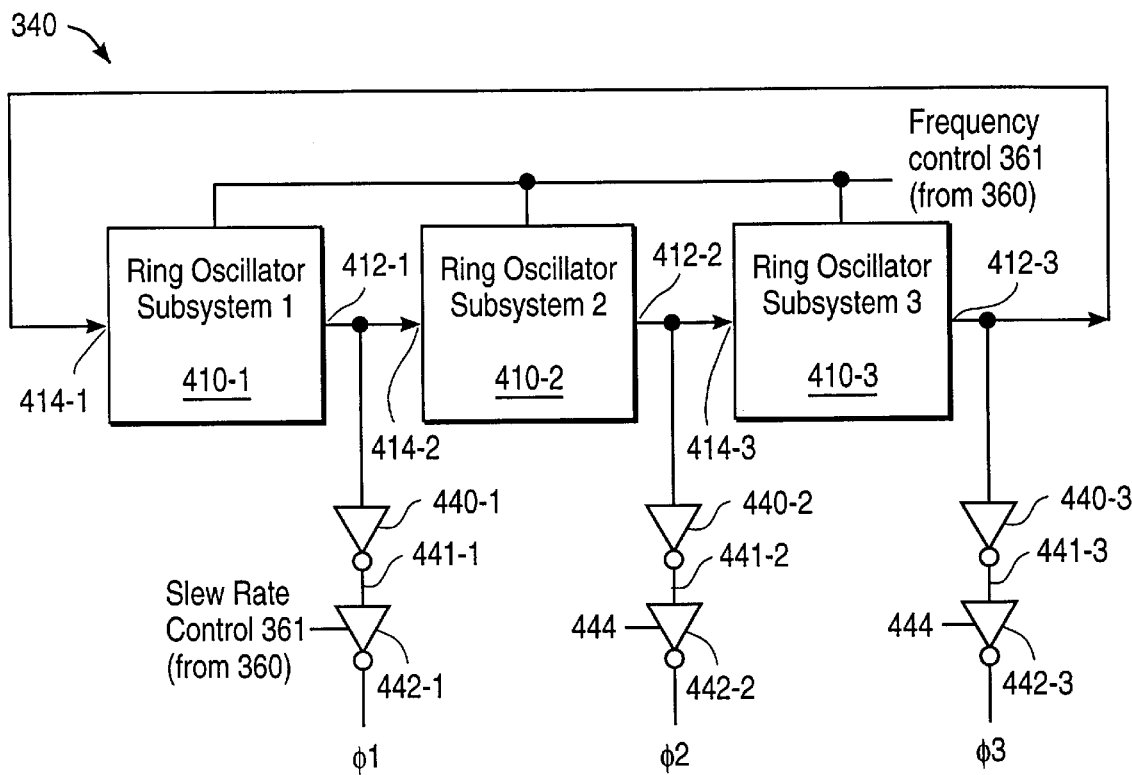
FIG. 6 is a block diagram of the ring oscillator 340 of FIG. 4A.

FIG. 6 shows a preferred embodiment of the ring oscillator 340. In this embodiment a ring oscillator subsection 410 is provided for each clock signal φi being generated. Thus, the preferred embodiment makes use of three oscillator subsections 410-1, 410-2 and 410-3. The oscillator subsections 410 are connected in a ring so that the output 412 of one oscillator 410 forms the input 414 of another oscillator 410. The period T of each oscillator subsection 410 is determined by the feedback signal 361 from the comparator 360. In the preferred embodiment, shorter periods T (i.e., higher clock frequencies) result from larger feedback signals 361. Each of the respective periods T-1, T-2, T-3 of the clock signals φ1, φ2, φ3 (FIG. 5A) is the same as the oscillator period T.

The output 412 of each subsection 410 is coupled to a pair of inverters 440, 442. Each inverter 442 is responsive to the feedback signal 361, which determines the slew rate of the clock signal φi generated by that inverter 442. Thus, the linkage between the slew rate and frequency of the clock signals φi is explained by the fact that they are both determined by the feedback signal 361. For example, fast slew rates and high frequencies occur together and slow slew rates and low frequencies occur together. Each inverter 442 generates a clock signal φi that is coupled to a corresponding capacitor 116. It is now described in reference to FIG. 7 how the slew rate of the clock signal φi is controlled by the inverter 442 in response to the feedback signal 361. Additional details of the means by which the period T of the voltage controlled oscillators (VCO) 410 is controlled by the feedback signal 361 are not provided as the implementation of VCOs is well-known.

Figure 7:
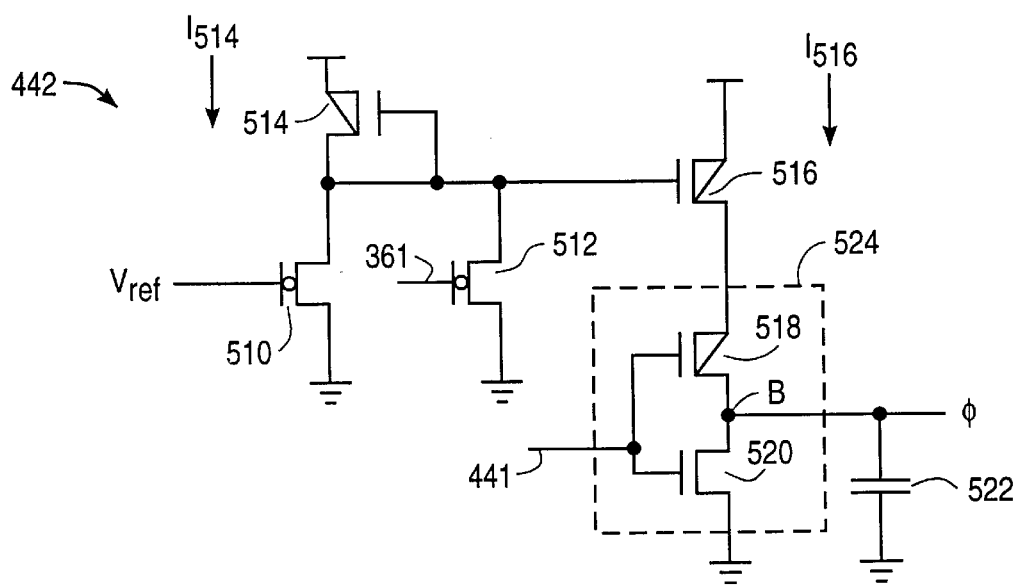
FIG. 7 is a circuit diagram of a preferred embodiment of a ring oscillator subsection 410 of FIG. 6.

Referring to FIG. 7, there is shown a preferred embodiment of the inverter 442. The preferred embodiment includes two n-channel, native mode transistors 510, 512; three p-channel enhancement mode transistors 514, 516, 518; and one n-channel enhancement mode transistor 520. The gates of the native mode transistors 510 and 512 are respectively tied to a reference voltage $V_{ref}$ and the feedback signal 361. The gates of the p-channel transistor 518 and the n-channel transistor 520 are coupled to the output 441 of the inverter 440. The drains of the p-channel and n-channel transistors 518, 520 are coupled at a node B that provides the clock signal φi. Node B is also tied to a capacitor 522 that determines to the slew rate (ramp) characteristics of the clock signal φi.

The transistors 510, 512 and 514 constitute a voltage divider network that establishes the voltage at the gates of the p-channel transistors 514 and 516. As the p-channel transistors 514, 516 are the same size, this arrangement forms a current mirror wherein the current $I_{516}$ drawn by the transistor 516 is close to or identical to the current $I_{514}$ drawn by the transistor 514. The current $I_{516}$ determines the slew rate of the clock signal φi. In particular, a large current $I_{516}$ results in a fast slew rate and a small current results in a slow slew rate. The current $I_{514}$, which determines the current $I_{516}$, is set by operation of the n-channel, native-mode transistors 510, 512 as follows.

The n-channel, native-mode transistor 510 draws a stable current that is determined by the fixed reference voltage Vref. In the preferred embodiment the reference voltage Vref is the bandgap reference (approximately +1.28V). When the transistor 512 is not active, the basic current drawn by the transistor 510 solely determines the current $I_{514}$ and the gate voltages of the transistors 514, 516. The basic current is supplemented by the current drawn by the n-channel, native-mode transistor 512, which is determined by the magnitude of the feedback control signal 361. As the feedback control signal 361 grows larger, the transistor 512 turns on harder, drawing more current, which increases the currents $I_{514}$, $I_{516}$.

The current $I_{516}$ determines how the transistors 518, 520 and the capacitor 522 set the ramp characteristics of the clock signal φi. The transistors 518, 520 generate the clock signal φi by inverting the periodic signal 441 (FIG. 6) output by the inverter 440. This produces a clock signal φi that has the desired phase relationship with the output 412-i from the corresponding oscillator sub-system 410-i. The ramp characteristics of the clock signal φi are determined by the capacitor 522 in accordance with the current $I_{516}$. At higher current $I_{516}$ levels, the capacitor 522 charges up faster, resulting in a faster slew rate (i.e. shorter ramp). At lower current $I_{516}$ levels, the capacitor 522 charges up slower yielding a slower slew rate (i.e. longer ramp).

Modifications and variations may be made to the disclosed embodiments without departing from the subject and spirit of the invention as defined by the following claims. For example, alternate preferred embodiments might adjust only one of clock frequency or slew rate in the manner described instead of adjusting both frequency and slew rate simultaneously.

What is claimed is:

1. A drain voltage pump circuit comprising:
    a ring oscillator circuit that provides at least three overlapping clock signals, each having a voltage profile and frequency controlled by the ring oscillator;
    a plurality of pump sections, each of which is configured to pump a drain voltage (VD) node in response to a respective one of the clock signals; the ring oscillator circuit individually controlling the frequency and the voltage profile of the clock signals so that the voltage at the VD node is pumped during an initial pumping interval from a VCC level to a target VD level and maintained throughout a programming cycle within a preset ripple range of the target VD level.

2. The drain voltage pump of claim 1, wherein, during a pumping operation, only the frequency of the clock signals is adjusted by the ring oscillator circuit.

3. The drain voltage pump of claim 1, wherein, during a pumping operation, only the voltage profile of the clock signals is adjusted by the ring oscillator circuit.

4. The drain voltage pump of claim 1, wherein, during a pumping operation, the frequency and voltage profile of the clock signals are adjusted simultaneously by the ring oscillator circuit.

5. The drain voltage pump of claim 1, wherein each of the pump sections comprises:
    two native-mode transistors, wherein the gate of a first one of the native mode transistors is coupled to a program signal, the drain of the first transistor is coupled to a VCC node, the source of the first transistor is coupled to interconnected drain and gate of a second one of the transistors and the source of the second transistor is coupled to a drain voltage (VD) node; and
    a capacitor, one terminal of which is coupled to the source of the first transistor and the interconnected drain and gate of the second transistor and a second terminal of which is coupled to a respective one of the clock signals.

6. The drain voltage pump of claim 1, wherein the capacitor comprises a native mode, MOS capacitor.

7. The drain voltage pump of claim 1, wherein the ring oscillator circuit comprises:
    a plurality of oscillator sections, each of which generates one of the respective clock signals and includes:

an oscillator subsystem with a ring output coupled to a ring input of a subsequent oscillator subsystem and a ring input coupled to the ring output of a previous oscillator subsystem, the oscillator subsystem generating on its ring output signal pulses at a desired frequency determined by a control signal; and an output circuit coupled to the ring output that, in response to each of the signal pulses, generates a clock pulse of the respective clock signal with a desired slew rate determined by the control signal;

a comparator that compares the voltage at the VD node (VD) to a target VD level ($VD_{target}$) and sets the control signal in accordance with the outcome of the comparison;

such that, when the control signal indicates a large difference between the VD and the $VD_{target}$, the oscillator subsystem increases the desired frequency and the output circuit increases the desired slew rate so that pumping action is increased; and when the control signal indicates a small difference between the VD and the $VD_{target}$, the oscillator subsystem decreases the desired frequency and the output circuit decreases the desired slew rate so that pumping action is decreased.

8. The drain voltage pump of claim 7, wherein the clock signals comprise three overlapping clock signals and the plurality of oscillator subsections comprises three oscillator subsections.

9. The drain voltage pump of claim 7, wherein the comparator comprises:

a comparator circuit with inverting and non-inverting inputs, the non-inverting input being connected to a stable reference voltage and the inverting input being connected to a first voltage to be compared to the reference voltage; and a voltage divider with one end connected to the VD node, the other end connected to a ground node and an output node that provides the first voltage, the voltage divider being configured so that the first voltage is close to the reference voltage when the VD is close to the $VD_{target}$;

the comparator being configured to output the control signal so that the magnitude of the control signal is directly related to the difference between the VD and the $VD_{target}$.

10. The drain voltage pump of claim 9, wherein the reference voltage is determined by a bandgap reference voltage.

11. The drain voltage pump of claim 10, wherein the bandgap reference is approximately 1.28 V.

12. The drain voltage pump of claim 11, wherein the $VD_{target}$ is between 5.5 volts and 6.0 volts.

13. The drain voltage pump of claim 9, wherein the voltage divider comprises:

two resistors R1 and R2 whose values are determined in accordance with:

$$V_{ref} \frac{R1 + R2}{R2} = VD_{target}$$

where $V_{ref}$ represents the voltage reference and R1 and R2 respectively represent the resistances of the resistors R1 and R2.

14. The drain voltage pump of claim 7, wherein the output circuit comprises:

a second inverter having an input driven by a periodic signal at the desired frequency, an output that provides a respective one of the clock signals and a pull-up input that is connected to the control signal, the inverter adjusting the slew rate of the corresponding clock signal in accordance with the magnitude of the control signal.

15. The drain voltage pump of claim 14, wherein the inverter is configured to adjust the slew rate of the respective clock signal by providing a faster slew rate when the control signal is large and with a slower slew rate when the control signal is small.

16. The drain voltage pump of claim 15, wherein the second inverter comprises:

first and second n-channel, native-mode transistors;

first and second p-channel transistors;

an inverting circuit; and a capacitor;

the first n-channel transistor having a gate coupled to a second reference voltage, a source coupled to a ground node and a drain coupled to the drain of the first p-channel transistor;

the first p-channel transistor having interconnected gate and drain terminals and a source coupled to the VCC node;

the second n-channel transistor having a gate coupled to the control signal, a source coupled to the ground node and a drain coupled to the gate and drain of the first p-channel transistor;

the second p-channel transistor being the same size as the first p-channel transistor and having a gate coupled to the gate of the first p-channel transistor, a source coupled to the VCC node and a drain coupled to a pull-up that determines how much current is supplied to the inverting circuit, the supplied current mirroring the current drawn by the first p-channel transistor;

the inverter having a second input that is coupled to the output of the first inverter and a second output that provides the corresponding clock signal;

the capacitor being connected between the ground node and the second output, such that the capacitor determines the slew rate of the corresponding clock signal in direct correlation with the level of the supplied current, the level of the supplied current being large when the control signal is large and small when the control signal is small.

17. The drain voltage pump of claim 16, wherein the second reference voltage is determined by a bandgap reference voltage.

18. The drain voltage pump of claim 17, wherein the bandgap reference is approximately 1.28V.

* * * * *